United States Patent
Zhang et al.

(10) Patent No.: US 11,575,104 B2
(45) Date of Patent: Feb. 7, 2023

(54) FLEXIBLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Zhuo Zhang, Hubei (CN); Haochun Lee, Hubei (CN); Xiaomeng Hou, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 279 days.

(21) Appl. No.: 16/955,580

(22) PCT Filed: Jan. 3, 2020

(86) PCT No.: PCT/CN2020/070278
§ 371 (c)(1),
(2) Date: Jun. 18, 2020

(87) PCT Pub. No.: WO2021/120342
PCT Pub. Date: Jun. 24, 2021

(65) Prior Publication Data
US 2022/0140278 A1 May 5, 2022

(30) Foreign Application Priority Data

Dec. 17, 2019 (CN) .......................... 201911300318.0

(51) Int. Cl.
H01L 51/52 (2006.01)
B32B 7/12 (2006.01)
H01L 27/32 (2006.01)

(52) U.S. Cl.
CPC ............ H01L 51/5237 (2013.01); B32B 7/12 (2013.01); B32B 2307/41 (2013.01);
(Continued)

(58) Field of Classification Search
CPC ..................................................... G06F 1/1652
See application file for complete search history.

(56) References Cited

U.S. PATENT DOCUMENTS

2003/0134488 A1 7/2003 Yamazaki
2015/0086763 A1* 3/2015 Nam ....................... B32B 7/027
428/212

(Continued)

FOREIGN PATENT DOCUMENTS

CN 104553184 A 4/2015
CN 105513497 A 4/2016
(Continued)

*Primary Examiner* — Ian A Rummel

(57) ABSTRACT

A flexible display device includes a flexible display panel bendable along a bending axis. A support backplate is disposed on a side of the flexible display panel and located on an outer side of the flexible display panel when bending. The support backplate includes a support area and a plurality of extension areas defined on opposite sides of the bending axis and adjoining two sides of the support area. When the flexible display device is in an expanded state, a difference value between a length of the support backplate and a length of the flexible display panel in a direction perpendicular to the bending axis is greater than or equal to a first threshold. The flexible display device can reduce the risk of peeling of components in a bent state and can ensure a product lifespan.

8 Claims, 3 Drawing Sheets

(52) U.S. Cl.
CPC ..... *B32B 2307/412* (2013.01); *B32B 2307/42* (2013.01); *B32B 2457/208* (2013.01); *H01L 27/3244* (2013.01); *H01L 2251/5338* (2013.01)

(56) References Cited

U.S. PATENT DOCUMENTS

| | | | |
|---|---|---|---|
| 2017/0331076 A1 | 11/2017 | Misono | |
| 2018/0290430 A1* | 10/2018 | Liu | ........................ B32B 7/05 |
| 2020/0006679 A1 | 1/2020 | Li | |

FOREIGN PATENT DOCUMENTS

| | | | |
|---|---|---|---|
| CN | 107195253 A | 9/2017 |
| CN | 108665804 A | 10/2018 |
| CN | 108831301 A | 11/2018 |
| CN | 108877524 A | 11/2018 |
| CN | 108898957 A | 11/2018 |
| CN | 109509402 A | 3/2019 |
| CN | 109599503 A | 4/2019 |
| CN | 109961692 A | 7/2019 |
| CN | 110197620 A | 9/2019 |
| CN | 110277023 A | 9/2019 |
| CN | 110491298 A | 11/2019 |
| WO | 2016088615 A2 | 6/2016 |

\* cited by examiner

FLEXIBLE DISPLAY DEVICE

BACKGROUND OF INVENTION

1. Field of Invention

The present invention relates to a technical field of displays, and particularly to, a flexible display device.

2. Related Art

Currently, foldable flexible organic light-emitting diode (OLED) display devices have been put on the market, facilitating simple and convenient lives.

Foldable flexible OLED display devices are receiving widespread attention. Reliability and durability of display devices are key factors to determine whether the devices can quickly grab the market. General foldable flexible display devices include flexible covers, adhesives, functional layers, flexible display devices, adhesives, and supporting materials from top to bottom. The supporting materials are rigid materials. Each of thin-film layers has a certain thickness. In a situation that stack structures bend inward, edges of devices will inevitably be sheared due to differences between inner and outer radiuses. That is, after bending, edges of the thin-film layers are not flush with each other, thereby easily resulting in peeling of the thin-film layers. Furthermore, screen bodies and other structures are assembled with outermost supporting material layers as a reference base. As a result, materials such as flexible covers on insides of display devices will be subject to compressive stress from structural casings (i.e. supporting materials) on outer sides, causing unnecessary deformation and increasing the risk of peeling of components. Therefore, OLED screens including flexible and rigid materials need to be accurately assembled with structural casings to minimize stress on the screens, reduce the risk of screen peeling, and maintain and extend reliability of the product.

SUMMARY OF INVENTION

An object of the present invention is to provide a flexible display device including a device casing having outer edges flush with outer edges of inner film layer structures in a bent state, thereby to improve assembly accuracy, reduce the risk of peeling of components, and ensure a product lifespan.

In order to achieve the above-mentioned object, the present applications provides a flexible display device, comprising a flexible display panel bendable along a bending axis; a support backplate disposed on a side of the flexible display panel and located on an outer side of the flexible display panel with respect to a direction that the flexible display panel is bent, wherein the support backplate comprises a support area for supporting the flexible display panel, and a plurality of extension areas defined on opposite sides of the bending axis and adjoining two sides of the support area; wherein when the flexible display device is in an expanded state, a difference value between a length of the support backplate and a length of the flexible display panel in a direction perpendicular to the bending axis is greater than or equal to a first threshold Further, the first threshold is defined as $\pi(T-t1)$, wherein $\pi$ is Pi, T is an entire thickness of the flexible display device, and t1 is a thickness of the flexible display panel.

Further, the flexible display device further comprises a functional film layer disposed on a side of the flexible display panel away from the support backplate, wherein when the flexible display device is in the expanded state, a difference value between the length of the support backplate and a length of the functional film layer in the direction perpendicular to the bending axis is greater than or equal to a second threshold.

Further, the second threshold is defined as $\pi(T-t2)$, wherein $\pi$ is Pi, T is an entire thickness of the flexible display device, and t2 is a thickness of the functional film layer.

Further, the functional film layer comprises at least one of a touch layer and a polarizer layer.

Further, the flexible display device further comprises a flexible cover disposed on a side of the functional film layer away from the flexible display panel, wherein when the flexible display device is in the expanded state, a difference value between the length of the support backplate and a length of the flexible cover in the direction perpendicular to the bending axis is greater than or equal to a third threshold.

Further, the third threshold is defined as $\pi(T-t3)$, wherein $\pi$ is Pi, T is an entire thickness of the flexible display device, and t3 is a thickness of the flexible cover.

Further, each of the extension areas of the support backplate comprises an edge flush with opposite sides of the flexible display panel and the flexible cover, respectively, when the flexible display device is in a bent state.

Further, the support backplate is made of a dark opaque material.

Further, the support backplate is located at two opposite sides of the bending axis, and each of the extension areas adjoining the two sides of the support area has a same length.

The present application further provides a flexible display device, comprising a flexible display panel bendable along a bending axis; a support backplate disposed on a side of the flexible display panel and located on an outer side of the flexible display panel with respect to a direction that the flexible display panel is bent, wherein the support backplate comprises a support area for supporting the flexible display panel, and a plurality of extension areas defined on opposite sides of the bending axis and adjoining two sides of the support area; a functional film layer disposed on a side of the flexible display panel away from the support backplate; and a flexible cover disposed on a side of the functional film layer away from the flexible display panel; wherein when the flexible display device is in an expanded state, in a direction perpendicular to the bending axis, a difference value between a length of the support backplate and a length of the flexible display panel is greater than or equal to a first threshold, a difference value between the length of the support backplate and a length of the functional film layer is greater than or equal to a second threshold, and a difference value between the length of the support backplate and a length of the flexible cover is greater than or equal to a third threshold.

The flexible display device of the present application is provided with the support area and the extension areas defined on opposite sides of the bending axis and adjoining two sides of the support area. In this manner, when the flexible display device is in an expanded state, a difference value between a length of the support backplate and each of lengths of the flexible display panel, the functional film layer, and the flexible cover in a direction perpendicular to the bending axis is greater than or equal to a first threshold defined as $\pi(T-t1)$, a second threshold defined as $\pi(T-t2)$, and a third threshold defined as $\pi(T-t3)$, respectively. Based on the flexible display device, in the bent state, edges of the two extension areas of the support backplate are flush with two opposite sides of each of the flexible display panel, the functional film layer, and the flexible cover, respectively, thereby effectively improving accuracy in assembling the device and reducing the risk of squeezing the flexible cover or a display module on an inner side when bending. On the other hand, based on the flexible display device, a sheared edge between an inner screen body and an outer casing (i.e. support backplate) of the device can be minimized, a capability to resist an external impact on the screen body can be increased, and light leakage at edges can be prevented, thereby effectively overcoming problems that conventional flexible display devices have poor assembly accuracy, internal components are prone to be squeezed when bending, film layers are likely to peel off, and display performance and lifespan of devices are adversely affected.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

The present application relates to a flexible display device, and particularly to a flexible display device capable of being self-luminous using organic light-emitting materials and being bendable to deform in a bent state or an expended state. The flexible display device of the present application can provide users with various usage patterns, including transformation of small-sized mobile phones or large-sized tablets by bending, and product reliability of the display device will not be affected due to bending.

Figure 1:
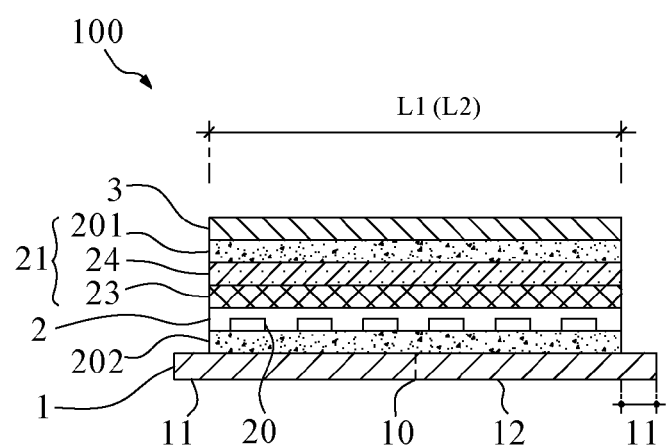
FIG. 1 is a schematic structural view of a flexible display device in accordance with an embodiment of the preset application.

Please refer to FIG. 1 showing a schematic structural view of a flexible display device in accordance with an embodiment of the preset application. A flexible display device 100 of the present application includes a support backplate 1, a flexible display panel 2, and a flexible cover 3 bendable along a bending axis 10. It should be noted that, in this embodiment, the bending axis 10 is disposed longitudinally, while in another embodiment, an additional bending axis may be transversely disposed and may be perpendicular to and intersect the longitudinal bending axis 10. The support backplate 1 is disposed on a side of the flexible display panel 2 and is located on an outer side of the flexible display panel 2 with respect to a direction that the flexible display panel 2 is bent. The support backplate 1 includes a support area 12 for supporting the flexible display panel 2, and a plurality of extension areas 11 defined on opposite sides of the bending axis 10 and adjoining two sides of the support area 12. In this embodiment, the support backplate 1 is made of stainless steel (SUS), glass, or a high-modulus material greater than 100 GPa (Pa).

As shown in FIG. 1, the flexible display panel 2 is laminated on the support area 12 of the support backplate 1. A functional film layer 21 is disposed on a side of the flexible display panel 2 away from the support backplate 1. The functional film layer 21 includes a touch layer 23 or a polarizer layer 24, and an upper optical clear adhesive (OCA) layer 201 sequentially disposed on the flexible display panel 2. The flexible display panel 2 includes an organic light-emitting module 20, and a lower OCA layer 202 is disposed between the flexible display panel 2 and the support backplate 1. In this embodiment, the organic light-emitting module 20 includes a plurality of organic light-emitting devices composed of general thin-film transistors and organic light-emitting materials, and their detailed structure is not described here. In addition, most functions and structures of the touch layer 23 and the polarizer layer 24 are the same as those of conventional techniques, and will not be described here. Specifically, a first length L1 is defined between two sides of the flexible display panel 2, and is the same as a length of the support area 12. In other words, two opposite ends of each of film layers of the functional film layer 21 are flush with two opposite ends of the flexible display panel 2, respectively.

Please continue referring to FIG. 1. The flexible cover 3 is laminated on the functional film layer 21. Specifically, the flexible cover 3 is disposed on a side of the functional film layer 21 away from the flexible display panel 2. A second length L2 is defined between two opposite ends of the flexible cover 3 and has the same length as the first length L1. The flexible cover 3 is provided to protect the flexible display panel 2. Furthermore, in this embodiment, the bending axis 10 is located at a middle of the support backplate 1. As shown in FIG. 1, the support backplate 1 has two extension areas 11 extending outward of two opposite ends of each of the flexible display panel 2 and the flexible cover 3. That is, the support backplate 1 is configured with a length difference with the flexible display panel 2, a length difference with the functional film layer 21, and a length difference with the flexible cover 3. The length difference is a sum of lengths of the two extension areas 11 of the support backplate 1.

Figure 2:
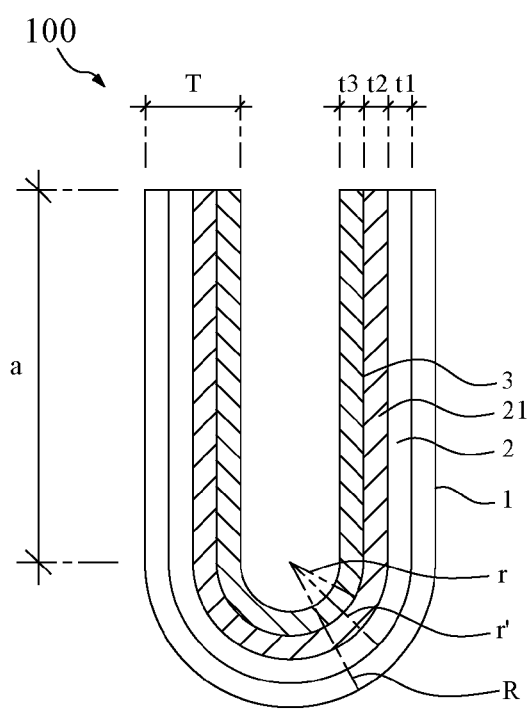
FIG. 2 is a schematic structural view showing a flexible display device in a bent state in accordance with an embodiment of the preset application.
Figure 3:
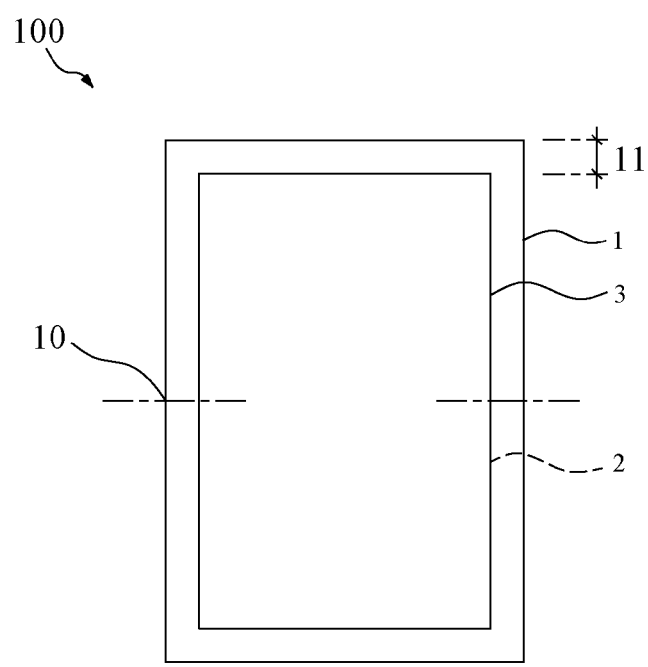
FIG. 3 is a schematic plan view of a flexible display device in accordance with an embodiment of the preset application.

Please refer to FIG. 2 showing a schematic structural view of a flexible display device 100 in a bent state in accordance with an embodiment of the preset application, wherein layer structures of the flexible display panel 2 and the functional film layer 21 are omitted to be shown in FIG. 2. Specifically, each of the support backplate 1, the flexible display panel 2, and the flexible cover 3 includes a bending area corresponding to each other and a non-bending area corresponding to each other. Particularly, when the flexible display device 100 is in an expanded state (as shown in FIGS. 1 and 3), a difference value between a length of the support backplate 1 and a length (i.e. the first length L1) of the flexible display panel 2 in a direction perpendicular to the bending axis 10 is greater than or equal to a first threshold. In this embodiment, the first threshold is defined as $\pi(T-t1)$, wherein $\pi$ is Pi, T is an entire thickness of the flexible display device 100, and t1 is a thickness of the flexible display panel 2 (as shown in FIG. 2). Specifically, the flexible display panel 2 has a bending radius designated as r', the bending area of the support backplate 1 has a bending radius designated as R, and the non-bending area has a length designated as a. In this embodiment, a difference value (i.e. a total length of the two extension areas 11) between a length of the support backplate 1 located on an outer side of the flexible display device and a length of the flexible display panel 2 located on an inner side of the flexible display device is defined by an equation $M=(2a+\pi R)-(2a+\pi r')=\pi(R-r')=\pi(T-t1)$, so that the first threshold $\pi(T-t1)$ can be proved by the equation.

Likewise, in another embodiment, when the flexible display device 100 is in the expanded state, a difference value between the length of the support backplate 1 and a length of the functional film layer 21 in the direction perpendicular to the bending axis is greater than or equal to a second threshold. Specifically, the second threshold is defined as $\pi(T-t2)$, wherein $\pi$ is Pi, T is the entire thickness of the flexible display device 100, and t2 is a thickness of the functional film layer 21 (as shown in FIG. 2).

In another embodiment, when the flexible display device 100 is in the expanded state, a difference value between the length of the support backplate 1 and a length of the flexible cover 3 in the direction perpendicular to the bending axis is greater than or equal to a third threshold. Specifically, the third threshold is defined as $\pi(T-t3)$, wherein $\pi$ is Pi, T is the entire thickness of the flexible display device 100, and t3 is a thickness of the flexible cover 3. As shown in FIG. 2, the flexible cover 3 has a bending radius designated as r, the bending area of the support backplate 1 has a bending radius designated as R, and the non-bending area has a length designated as a. In this embodiment, a difference value (i.e. a total length of the two extension areas 11) between the length of the support backplate 1 located on the outer side of the flexible display device and a length of the flexible cover 3 located on an inner side of the flexible display device is defined by an equation $M=(2a+\pi R)-(2a+\pi r)=\pi(R-r)=\pi(T-t3)$, so that the second threshold $\pi(T-t3)$ can be proved by the equation.

As described above, the support backplate 1 is configured with a length difference with the flexible display panel 2, a length difference with the functional film layer 21, and a length difference with the flexible cover 3, respectively. That is, in a condition that a total length of the two extension areas 11 of the support backplate 1 is greater than or equal to the first threshold, the second threshold, or the third threshold, outer edges of a device can be flush with two opposite ends of each of the flexible cover 3, the flexible display panel 2, and the functional film layer 21 in the bent state, thereby overcoming a problem of a device likely to have sheared edges due to differences between inner and outer radiuses of the device in the bent state.

FIG. 3 shows a schematic plan view of a flexible display device in accordance with an embodiment of the preset application. As shown in FIG. 3, the support backplate 1 includes a plurality of extension areas surrounding the flexible display panel 2 and the flexible cover 3. A total length of the extension areas 11 in a same axial direction is greater than or equal to the first threshold, the second threshold, and the third threshold. Furthermore, the support backplate 1 is made of a dark opaque material, such as a black material is used for the entire support backplate 1. By providing the support backplate 1 made of a black material, a possibility of causing light leakage at edges due to a stack structure of the flexible display device 100 may be effectively avoided.

Figure 4:
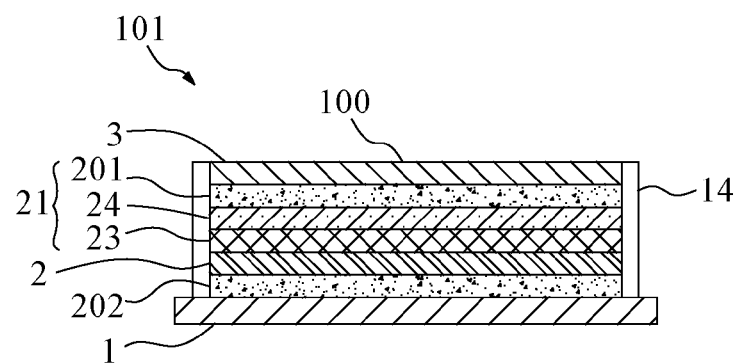
FIG. 4 is another schematic structural view of a flexible display device in accordance with an embodiment of the preset application.

FIG. 4 is another schematic structural view of a flexible display device in accordance with an embodiment of the preset application. As shown in FIG. 4, the present application further provides flexible display equipment 101 including the flexible display panel 100 in accordance with any embodiment as described above, wherein the detailed structure of the flexible display device 100 is not described here. As shown in FIG. 4, an encapsulation layer 14 is further provided around the flexible display device 100 to prevent external moisture and oxygen from entering.

The flexible display device of the present application is provided with the support area and the extension areas defined on opposite sides of the bending axis and adjoining two sides of the support area. In this manner, when the flexible display device is in an expanded state, a difference value between a length of the support backplate and each of lengths of the flexible display panel, the functional film layer, and the flexible cover in a direction perpendicular to the bending axis is greater than or equal to a first threshold defined as $\pi(T-t1)$, a second threshold defined as $\pi(T-t2)$, and a third threshold defined as $\pi(T-t3)$, respectively. Based on the flexible display device, in the bent state, edges of the two extension areas of the support backplate are flush with two opposite sides of each of the flexible display panel, the functional film layer, and the flexible cover, respectively, thereby effectively improving accuracy in assembling the device and reducing the risk of squeezing the flexible cover or a display module on an inner side when bending. On the other hand, based on the flexible display device, a sheared edge between an inner screen body and an outer casing (i.e. support backplate) of the device can be minimized, a capability to resist an external impact on the screen body can be increased, and light leakage at edges can be prevented, thereby effectively overcoming problems that conventional flexible display devices have poor assembly accuracy, internal components are prone to be squeezed when bending, film layers are likely to peel off, and display performance and lifespan of devices are adversely affected.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:
1. A flexible display device, comprising:
a flexible display panel bendable along a bending axis;
a support backplate disposed on a side of the flexible display panel and located across opposite sides of the bending axis, wherein the support backplate comprises a support area for supporting the flexible display panel, and a plurality of extension areas located on opposite sides of the support backplate and adjoining two sides of the support area, wherein each of the extension areas has a same length; and
a functional film layer disposed on a side of the flexible display panel away from the support backplate;
wherein when the flexible display device is in an expanded state, a difference value between a length of the support backplate and a length of the flexible display panel in a direction perpendicular to the bending axis is greater than or equal to a first threshold, and a difference value between the length of the support backplate and a length of the functional film layer in the direction perpendicular to the bending axis is greater than or equal to a second threshold equal to the first threshold;
wherein a center line of each of the flexible display panel, the support backplate, and the functional film layer coincides with the bending axis, and each of the extension areas is equally spaced apart from the center line of each of the flexible display panel, the support backplate, and the functional film layer.

2. The flexible display device of claim 1, wherein the first threshold is defined as $\pi(T-t1)$, wherein $\pi$ is Pi, T is an entire thickness of the flexible display device, and t1 is a thickness of the flexible display panel.

3. The flexible display device of claim 1, wherein the second threshold is defined as $\pi(T-t2)$, wherein $\pi$ is Pi, T is an entire thickness of the flexible display device, and t2 is a thickness of the functional film layer.

4. The flexible display device of claim 3, wherein the functional film layer comprises at least one of a touch layer and a polarizer layer.

5. The flexible display device of claim 1, further comprising a flexible cover disposed on a side of the functional film layer away from the flexible display panel, wherein when the flexible display device is in the expanded state, a difference value between the length of the support backplate and a length of the flexible cover in the direction perpendicular to the bending axis is greater than or equal to a third threshold.

6. The flexible display device of claim 5, wherein the third threshold is defined as $\pi(T-t3)$, wherein $\pi$ is Pi, T is an entire thickness of the flexible display device, and t3 is a thickness of the flexible cover.

7. The flexible display device of claim 5, wherein each of the extension areas of the support backplate comprises an edge flush with opposite sides of the flexible display panel and the flexible cover, respectively, when the flexible display device is in a bent state.

8. The flexible display device of claim 1, wherein the support backplate is made of a dark opaque material.

* * * * *